United States Patent [19]

Hu

[11] Patent Number: 5,070,046

[45] Date of Patent: Dec. 3, 1991

[54] DIELECTRIC COMPOSITIONS

[75] Inventor: Yung-Haw Hu, Hockessin, Del.

[73] Assignee: E. I. Du Pont de Nemours and Company, Wilmington, Del.

[21] Appl. No.: 423,367

[22] Filed: Oct. 19, 1989

[51] Int. Cl.⁵ .............................................. C03C 10/08
[52] U.S. Cl. ........................................ 501/9; 501/65; 501/69; 501/77
[58] Field of Search ................... 501/9, 77, 65, 66, 68, 501/69; 156/89

[56] References Cited

U.S. PATENT DOCUMENTS

| | | | |
|---|---|---|---|
| 4,413,061 | 1/1983 | Kumar et al. ............................. | 501/7 |
| 4,549,621 | 9/1985 | Eggerding et al. ................. | 428/209 |
| 4,655,864 | 4/1987 | Rellick .................................. | 156/89 |
| 4,731,347 | 3/1988 | Stetson .................................. | 501/21 |
| 4,749,665 | 6/1988 | Yano et al. ............................. | 501/32 |
| 4,788,046 | 11/1988 | Barringer et al. ..................... | 423/87 |
| 4,861,646 | 8/1989 | Barringer et al. ................... | 428/210 |
| 4,883,705 | 11/1989 | Kawakami .......................... | 428/209 |

*Primary Examiner*—William R. Dixon, Jr.
*Assistant Examiner*—Chris Gallo

[57] ABSTRACT

A composition for making dielectric layers having low dielectric constant, the composition comprising an admixture of finely divided solids comprising lead-free amorphous borosilicate glass and cordierite glass. The dielectric layers are useful in circuits, especially multilayers circuits for high density applications.

20 Claims, 1 Drawing Sheet

DIELECTRIC COMPOSITIONS

FIELD OF INVENTION

The invention relates to dielectric compositions, especially those which are useful in forming multilayer circuits.

BACKGROUND OF THE INVENTION

Multilayer thick film circuits have been used for many years to increase circuit functionality per unit of area. Moreover, recent advances in circuit technology have placed new demands on dielectric materials for this use. Heretofore, most of the dielectric materials used in multiple circuits have been conventional thick film dielectric compositions. These are comprised of finely divided particles of dielectric solids and inorganic binders dispersed in an inert organic medium. Such thick film materials are usually applied by screen printing, though they may be applied by other means as well. Thick film materials of this type are very important and will continue to be so.

In constructing a multilayer circuit using thick film materials, it is necessary sequentially to print, dry and fire each functional layer before the next layer is applied. Thus, in a typical situation involving multicircuits having, say, twenty layers, sixty separate processing steps are required as well as twenty inspections to assure the quality of each of the processed layers. Such a complex process is, of course, expensive both because of the great number of steps and because of the high yield losses which are normally incident to such a complex procedure.

Another approach to this problem has been the use of dielectric tapes which are thin sheet of ceramic dielectric material, such as alumina. The tape process involves lamination of a number of sheets of unfired tape (usually alumina) interspersed with alternating printed layers of conductive material. However, very high temperatures (e.g. on the order of 1600° C.) are required to sinter the alumina. Thus, only very high melting conductive materials such as tungsten and molybdenum can be used. Unfortunately, molybdenum and tungsten have poor conductivity properties which make them less satisfactory for very high speed, highly complex circuitry.

Recently, low temperature co-fired (LCTF) technology has been introduced as a method for fabricating multilayer circuits. This technology offers the combination of the processing advantages of the alumina-based tape technology plus the materials advantages of thick film technology. The LTCF tape systems have firing temperatures below 1000° C. and allow the use of high conductivity metals such as silver, gold, platinum, nickel and copper.

However, these tapes do have certain disadvantages. Most dielectric tape systems have problems with excessive movement of conductor patterns when the parts are fired more than once. In general, the multilayer structure is laminated together, fired and then a surface metallization is applied and the part is fired again. During this second firing step, the fluidity of the ceramic material may allow shifting or distortion of the conductor patterns. This, in turn, prevents attainment of the rigid tolerances for dimensions that have to be met. In addition, many of the tape systems have dielectric constants (K) between 6 and 8 which result in unacceptably high propagation delays in multilayer interconnect systems. Some tape systems suffer from high dielectric loss. And some tape systems have thermal coefficients of expansion (TCE) which do not match the TCE's of components or other substrates.

From the foregoing, it can be seen that there is a substantial need for a low temperature co-fireable tape dielectric which (1) retains dimensional stability even during multiple firing steps; (2) has a low dielectric constant (less than 5); (3) has low dielectric loss; and (4) has a variable TCE so that the TCE can be matched to the components or to other substrates.

SUMMARY OF THE INVENTION

In its primary aspect, the invention is directed to a composition for making low K dielectric layers comprising an admixture of finely divided solids comprising:

(a) 20-50% by weight, basis total solids, lead-free amorphous borosilicate glass (1) in which the weight ratio of $B_2O_3$ to $SiO_2$ is 0.22-0.55, and (2) containing, basis total glass, 0.5-1.5% by weight $Al_2O_3$, and 1.5-4.0% by weight of a mixture of oxides of alkali metals, alkaline earth metals or mixtures thereof, 0.3-1.0% weight, basis total solids, being $Li_2O$; and (b) 30-80% by weight, basis total solids, cordierite glass.

In a second aspect, the invention is directed to a tape casting composition comprising the above-described dielectric composition dispersed in a solution of binder/plasticizer matrix in a volatile nonaqueous solvent.

In a third aspect, the invention is directed to a method of forming unfired tape by casting a thin layer of the above described dispersion onto a flexible substrate, such as a steel belt or polymeric film, and heating the cast layer to remove the volatile solvent therefrom.

DETAILED DESCRIPTION OF THE INVENTION

A. Glass

Figure 1A:
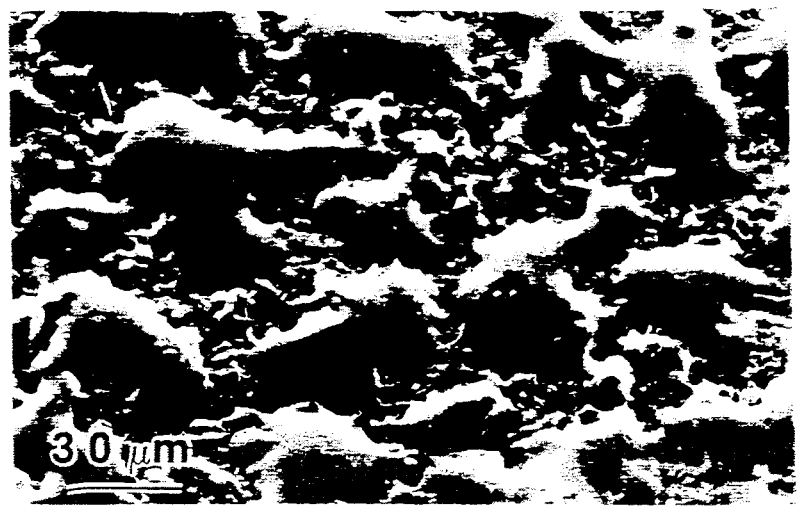
FIG. 1 shows scanning electron micrographs of fired parts in which the solids content of the dielectric sheets, based on the weight of the total solids, was (a) 80% glass, 10% alumina, 10% quartz; (b) 60% glass, 20% cordierite glass, 10% alumina, 10% quartz; and (c) 30% glass, 50% cordierite glass, 10% alumina, 10% quartz.

The glass compositions which can be used in the invention are amorphous borosilicate glasses containing 0.5-1.5% by weight alumina and 1.5-4.0% by weight alkali metal oxides and/or alkaline earth metal oxides. The borosilicate component of the glass must be within the range of 94.5-98.3% by weight of the glass. If less than 94.5% by weight borosilicate is used, the glass becomes too electroconductive and the dissipation factor (DF) becomes too high. On the other hand, if the borosilicate content is higher than 98.3% by weight, the sintering temperature of the glass exceeds practical firing temperatures. The weight ratio or $B_2O_3$ to $SiO_2$ should be within the range of 0.22 to 0.55 and preferably 0.25 to 0.40. It is preferred that the glass be capable of viscous phase sintering at 850°-950° C. A particularly preferred glass composition has the composition by weight 72% $SiO_2$, 25% $B_2O_3$, 1% $Al_2O_3$, 1% $K_2O$, 0.5% $Na_2O$ and 0.5% $Li_2O$.

It is required to have from 1.5 to 4.0% by weight oxides of alkali and/or alkaline earth metals or mixtures thereof which contain 0.3 to 1.0% by weight $Li_2O$. At least 1.5% by weight of such metal oxides are needed to obtain the proper low viscosity of the glass during firing. However, if more than 4.0% by weight is used, the conductivity of the sintered composition is likely to be too high. In order to minimize the amount of alkaline ions in the glass, it is preferred that the glass contain 0.3-1.0% by weight $Li_2O$ by which the lowest useful sintering viscosity can be obtained with the least amount of alkaline ions, i.e., alkali metal and alkaline metal earth ions. In addition, the amount of other alkali metal oxides ($Na_2O$, $K_2O$) should be kept below 3.0% by weight.

When ceramic fillers are used, a small amount of alumina is needed in the glass to reduce dissolution of the ceramic fillers into the glass when it is fired. At least 0.5% by weight alumina is needed for this purpose. However, if more than 1.5% by weight is used, the viscosity of the glass becomes excessive and wetting and sintering properties are affected adversely. In addition, the above-described glasses should contain essentially no Bi, Pb or other large polarizable ions which adversely affect the dielectric constant.

The glass should be present in the amount of 20-50% by weight, basis total solids, and preferably 30-40% by weight. The strength of the fired layers decreases as the glass concentration increases. Above about 50% by weight glass the structure tends to become too brittle and the properties of the associated conductive layers also tend to be degraded. On the other hand, if the amount of glass is less than 20% by weight, the fired structure is not sufficiently densified and is too porous.

The glass should be present as finely divided particles. The particle size, although not critical, is generally less than 25 microns. The preferred particle size is 4 to 6 microns at the 50% point on the distribution curve.

The glasses can be prepared by conventional glass-making techniques by mixing the desired components in the desired proportions and heating the mixture to form a melt. As is well known in the art, heating is conducted to a peak temperature and for a time such that the melt becomes entirely liquid and homogeneous. In the present work, this time period of about 1 to 1.5 hours. The melt is then quenched. The resulting crude frit is then milled to the desired particle size.

After discharging the milled-frit slurry from the mill, excess solvent is removed by decantation and the frit powder is air dried at room temperature. The dried powder is then filtered through a screen with openings the size of the largest desired particle to remove any large particles.

B. Cordierite

In order to achieve dimensional stability it is important that the second component of the composition be a material that is crystalline after firing. In crystallization, pervasive rigid networks of micron-sized crystallites are formed and this drastically reduces the overall fluidity of the material. However, the the proper sequence of events must take place during the firing process. The combination of glasses must remain in the melt phase while all of the organic binder is being burned off; next the glass must sinter; and finally it must crystallize. If crystallization occurs first, the resultant part has voids which lower the strength of the part. If sintering occurs first, binder is trapped in the tape which adversely affects the dielectric properties. In addition, the crytallizing glass must not react with the borosilicate glass described above. It is unusual to find glasses that melt together but do not react.

It is surprising to find that cordierite glass satisfies all of the above criteria. Cordierite, $2MgO.2Al_2O_3.5SiO_2$, is a glass which is amorphous at low temperatures, but crystalline after being exposed to high temperatures. It does not react with the borosilicate glass described above at firing temperatures. Combinations of the borosilicate glass and cordierite remain in the melt phase during organic burnout, then sinter and crystallize.

The cordierite should be present in an amount from 30-80% by weight based on total inorganic solids, and preferably from 45-55% by weight. If less than about 30% by weight cordierite is used, there is not sufficient crystallinity to achieve dimensional stability through multiple firings. If more than about 80% by weight cordierite is used the density of the fired material will be too low and the sheet too porous. In addition, the TCE is very low when the level of cordierite is very high.

The cordierite should be present as finely divided particles. None of the particles should exceed 15 microns in size and preferably they should not exceed 10 microns. It is preferred that the 50% point on the particle size distribution curve be not less than 1 micron and preferably in the range of 2-5 microns.

C. Ceramic Filler

Ceramic fillers may be added to the compositions of the invention in order to adjust the TCE. This may be done in order to match the TCE of the dielectric material with that of components or other substrates. The ceramic filler which may be used in the compositions of the invention may be selected from the group consisting of alumina, quartz, aluminum phosphate, aluminum nitride, boron nitride, fused silica and mixtures thereof. A preferred ceramic filler is quartz.

The ceramic filler may be present in an amount up to 40% by weight based on total inorganic solids. Preferably, it is present in an amount from 10-25% by weight. The ceramic filler should be present as finely divided particles. None of the particles should exceed 15 microns in size and preferably they should not exceed 10 microns. It is preferred that the 50% point on the particle size distribution curve be not less than 1 micron and preferably in the range of 2-5 microns.

D. Organic Medium

The organic medium in which the glass and inorganic solids are dispersed is comprised of a polymeric binder/plasticizer matrix which is dissolved in a volatile organic solvent and, optionally, other dissolved materials such as release agents, dispersing agents, stripping agents, antifouling agents and wetting agents.

To obtain better binding efficiency, it is preferred that the weight ratio of inorganic solids to polymer be at least 4:1 and no greater than 18:1. Within these limits, it is desirable to use the least possible amount of binder in order to reduce the amount of organics which must be removed by pyrolysis and to obtain better particle packing which gives reduced shrinkage upon firing.

In the past, various polymeric materials have been employed as the binder for green tapes, e.g., poly(vinyl butyral), poly(vinyl acetate), poly(vinyl alcohol), cellulosic polymers such as methyl cellulose, ethyl cellulose, hydroxyethyl cellulose, methylhydroxyethyl cellulose, atactic polypropylene, polyethylene, silicon polymers such as poly(methyl siloxane), poly(methylphenyl siloxane), polystyrene, butadiene/styrene copolymer, poly(vinyl pyrollidone), polyamides, high molecular weight polyethers, copolymers of ethylene oxide and propylene oxide, polyacrylamides, and various acrylic polymers such as sodium polyacrylate, poly(lower alkyl acrylates), poly(lower alkyl methacrylates), and various copolymers and multipolymers of lower alkyl acrylates and methacrylates. Copolymers of ethyl methacrylate and methyl acrylate and terpolymers of ethyl acrylate, methyl methacrylate and methacrylic acid have been previously used as binders for slip casting materials.

A preferred class of polymeric binders for making a tape from the composition of the invention are those disclosed in Usala, in U.S. Pat. No. 4,613,648. These polymeric binders are a mixture of compatible multipolymers of 0-100% by weight $C_{1-8}$ alkyl methacrylate, 100-0% by weight $C_{1-8}$ alkyl acrylate and 0-5% by weight ethylenically unsaturated carboxylic acid or amine, the multipolymer being further characterized as having a number average molecular weight ($M_n$) of 50,000 to 100,000, a weight average molecular weight ($M_w$) of 150,000 to 350,000, the ratio of $M_w$ to $M_n$ being no greater than 5.5, the total amount of unsaturated carboxylic acid or amine in the multipolymer mixture is 0.2-2.0% by weight, and the glass transition temperature ($T_g$) of the polymer and plasticizer therein, if any, is $-30$ to $+45$ C.

In addition to the polymeric binder, the organic matrix will also contain a small amount, relative to the binder polymer, of a plasticizer which serves to lower the $T_g$ of the binder polymer. The choice of plasticizers is, of course, determined primarily by the polymer which must be modified. Among the plasticizers which have been used in various binder systems are diethyl phthalate, dibutyl phthalate, dioctyl phthalate, butyl benzyl phthalate, alkyl phosphates, polyalkylene glycols, glycerol, poly(ethylene oxides), hydroxyethylated alkyl phenol, dialkyldithiophosphonate and poly(isobutylene). Of these, butyl benzyl phthalate is most frequently used in acrylic polymer systems because it can be used effectively in relatively small concentrations.

For casting solutions, the solvent component of the organic medium is chosen so as to obtain complete solution therein of the polymer and sufficiently high volatility to enable the solvent to be evaporated from the dispersion by the application of relatively low levels of heat at atmospheric pressure. In addition, the solvent must boil well below the boiling point and decomposition temperature of any other additives contained in the organic medium. Thus, solvents having atmospheric boiling points below 150 C. are used most frequently. Such solvents include benzene, acetone, xylene, methanol, ethanol, methyl ethyl ketone, 1,1,1-trichloroethane, tetrachloroethylene, amyl acetate, 2,2,4-triethylpentanediol-1,3-monoisobutyrate, toluene, methylene chloride, 2-propanol and trichlorotrifluoroethane.

E. Application

The tape is used primarily as a dielectric or insulating material for multilayer electronic circuits. A roll of unfired tape is blanked with registration holes in each corner to a size somewhat larger than the actual dimensions of the circuit. To connect various layers of the multilayer circuit, via holes are formed in the tape. This is typically done by mechanical punching. However, a sharply focused laser can be used to volatilize the unfired tape. Typical via hole sizes range from 0.0006 to 0.25 inch. The interconnections between layers are formed by filling the via holes with a thick film electrically functional paste. This paste is usually applied by standard screen printing techniques. Each layer of circuitry is completed by screen printing electrically functional tracks. Conductor, resistor, or high dielectric capacitor pastes can be printed on each layer to form conductive, resistive or capacitive circuit elements respectively. Also, specially formulated high dielectric constant tapes similar to those used in the multilayer capacitor industry can be incorporated as part of the multilayer circuitry.

After each layer of the circuit is completed, the individual layers are stacked and laminated. A confined pressing die is used to insure precise alignment between layers. The laminates are trimmed with a hot stage cutter.

Firing is carried out in a standard thick film conveyor belt furnace. Unlike many such dielectric compositions, those of the invention may be fired in oxidizing atmospheres such as air, in non-oxidizing atmospheres such as nitrogen, or in reducing atmospheres such as forming gas or $CO/CO_2$. The choice of firing atmosphere will usually be dictated by the oxidation stability of the conductive metal under firing conditions. When copper is used as the conductive metal it is necessary to use atmospheres which are slightly reducing in nature. It is preferred to use an atmosphere of CO and $CO_2$ with water vapor as described in allowed copending application Ser. No. 07/235,273, filed Sept. 23, 1988, by McEwen et al.

EXAMPLES

Casting solutions were formulated by dispersing the below-listed inorganic solids in solvent/polymer blends in a high speed dispersion mixer, a Waring blender. The dispersions were achieved by mixing for 10 minutes using the highest setting on the blender. The viscosity of solutions was measured on a Brookfield RVT viscometer using a spindle No. 5 at 20 rpm. Viscosities of the casting solutions ranged from 0.9 to 4.5 PaS. The solutions were formed into a tape by casting onto a silicone-coated polyester film at 60 C. The thickness of the cast tapes varied between 4.1 and 10 mils. The cast green sheets were blanked to the required dimensions in a blanking tool. Via holes were formed through blanked sheets using a punching machine with a punch and die. If an electrically functional layer was desired, a conductive copper oxide paste (80% copper oxide in ethyl cellulose) was screen printed onto the sheet. The screen printed sheets were then dried in an oven at 110° C. for 10 minutes. The printing conditions were selected so as to give a 15 micron thick layer using a 200 mesh screen. Samples were fabricated into a substrate geometry by laminating eight sheets together by means of a confined pressing die operated at 70° C. for 20 minutes under 3000 psi. The confined die prevents lateral distortion during pressing. Density in homogeneities in the laminated samples influence the shrinkage in the sintered substrate. Therefore, the lamination process should be homogeneously carried out by means of the correct die and punch with a flat surface.

For parts without copper metallization the following firing sequence was used: the unfired laminate was preheated at a rate of 1° to 2° C./min. in air and held at 500° C. for 3 to 6 hours to remove organic binders. After binder burn out, the rate of heating was increased to about 5° to 10° C./min., and the temperature held at 930°-950° C. (the crystallization temperature of cordierite glass) for 2 hours in nitrogen atmosphere. The fired parts were furnace cooled to room temperature.

The parts with copper metallization were fired with the following sequence: the unfired laminate was preheated at a rate of 1° to 2° C./min. to 500° C. and held there for 3 to 6 hours in air. After complete removal of the organic binders, the atmosphere was changed to 1% CO in $CO_2$ with about 3% water vapor and held at 450°-500° C. for 6 to 8 hours to effect complete reduction to copper metal. The atmosphere was then changed to nitrogen and the heating rate increased to 5°-10° C./min. to a peak temperature of 930-950 C. The temperature was held there for 2 hours and then the parts were furnace cooled to room temperature.

The glass used in the following examples corresponded to the preferred glass composition described hereinabove. The binder/plasticizer matrices used in the following examples corresponded to those of Usala, U.S. Pat. No. 4,613,648, described hereinabove. The solvent used in the following examples contained the following components in the ranges indicated:

| | |
|---|---|
| 1.1.1-Trichloroethane | 70-85% by weight |
| Methylene Chloride | 2-7% |
| Methyl Ethyl Ketone | 4-11% |
| Isopropanol | 2-6% |
| 1,1,2-Trichloro-1,2,2-trifluoroethane | 4-10% |

EXAMPLES 1-4

These examples demonstrate the effect of cordierite glass on the dimensional stability of fired parts.

Casting solutions were formulated using 52.00% by weight solids, 6.06% by weight polymer and 41.94% by weight solvent. The weight percent of cordierite glass in the solids was varied as shown in the table below. The parts were made by cofiring eight layers of dielectric tape which contained three buried copper layers as described above. A surface metallization layer of copper oxide paste was screen printed onto the fired multilayer substrate and then postfired using the same conditions. The dimensional stability of the fired parts was measured by the shrinkage in the x,y plane of the laminate, the flatness of the part, the morphologies of the fired top surface and the conductor line and via positions on the top surface.

| Example No. | 1 | 2 | 3 |
|---|---|---|---|
| Solids Composition (% Weight) | | | |
| Glass | 80.00 | 60.00 | 30.00 |
| Cordierite Glass | — | 20.00 | 50.00 |
| Alumina | 10.00 | 10.00 | 10.00 |
| Quartz | 10.00 | 10.00 | 10.00 |
| Properties | | | |
| K | 4.6 | 4.8 | 5.0 |
| TCE (ppm/C) | 5.0 | 4.7 | 4.5 |
| X,Y Shrinkage (%) | 24 | 17 | 12 |
| Flatness | edges lifted | almost flat | flat |
| Surface Morphology | glassy | slightly glassy | granular |
| Conductor/Via Position | distorted | slightly distorted | aligned |

Although the dielectric constant and the thermal coefficient of expansion do not change significantly as the amount of cordierite glass is increased, there is a dramatic increase in dimensional stability. Only when the cordierite glass is present in an amount above about 30% by weight is the dimensional stability adequate.

Figure 1B:
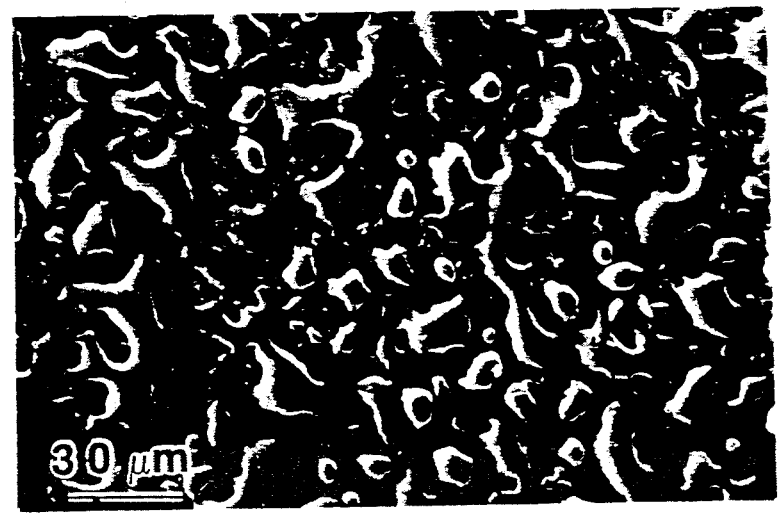
Figure 1C:
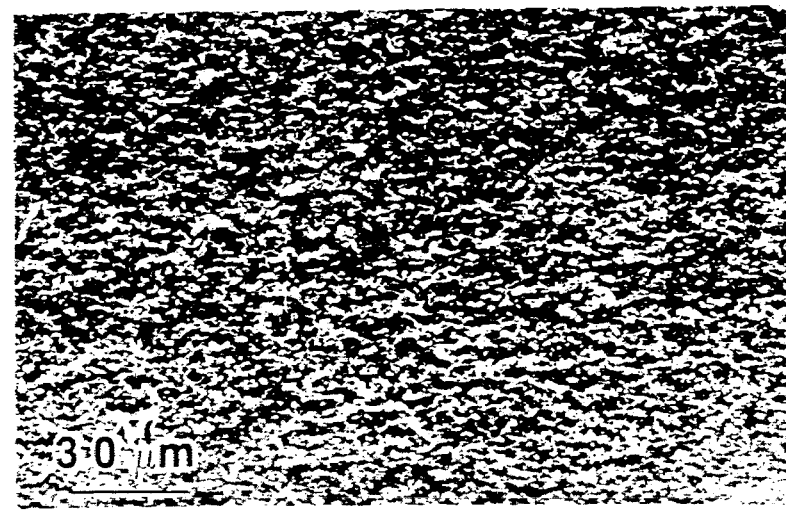

The effect of cordierite glass on the surface morphology is also illustrated in FIG. 1. FIG. 1a is a scanning electron micrograph of the surface of the part in Example 1. It can be seen that the surface is coated with a layer of glass. This surface glass coating makes the post metallization process extremely difficult due to shifting and covering of the metal by the glass. FIG. 1b is the scanning electron micrograph of the part in Example 2. Again, the glassy nature of the surface is apparent. FIG. 1c is the scanning electron micrograph of the part in Example 3 which illustrates the composition of the invention. The fired surface is flat and has the desired granular morphology.

EXAMPLES 4-12

The following examples illustrate the use of different fillers in dielectric compositions of the present invention and the variation in properties that can be achieved with these fillers.

Casting solutions were formulated with 54.91% by weight solids, 6.34% by weight polymer and 38.75% by weight solvent. The fillers used are listed below. The sheets were fired without any copper metallization using the conditions described above. The variations in dielectric constant and thermal coefficient of expansion are given below.

| Example No. | 4 | 5 | 6 | 7 | 8 | 9 | 10 | 11 | 12 |
|---|---|---|---|---|---|---|---|---|---|
| Solids Composition (% Weight) | | | | | | | | | |
| Glass | 20 | 20 | 20 | 30 | 20 | 20 | 30 | 40 | 20 |
| Cordierite Glass | 60 | 60 | 50 | 40 | 70 | 60 | 50 | 50 | 70 |
| Quartz | 20 | — | 15 | 10 | — | 10 | 10 | — | — |
| Alumina | — | 20 | 15 | 20 | — | — | — | — | — |
| AlN | — | — | — | — | 10 | 10 | — | — | — |
| BN | — | — | — | — | — | — | 10 | 10 | 10 |
| Properties | | | | | | | | | |
| K | 4.2 | 5.8 | 4.0 | 4.6 | 5.6 | 5.8 | 5.0 | 4.8 | 5.0 |
| TCE | 5.3 | 3.2 | 5.3 | 5.0* | 2.5 | 4.0 | 4.5 | 3.0 | 3.0 |

What is claimed is:

1. A composition for making low K dielectric layers comprising a dispersion of finely divided solids comprising:
   (a) 20-50% by weight, basis total solids, lead-free amorphous borosilicate glass (1) in which the weight ratio of $B^2O^3$ to $SiO^2$ is 0.22-0.55, and (2) containing, basis total borosilicate glass 94.5-98.3% by weight borosilicate, 0.5-1.5% by weight $Al^2O^3$, and 1.5-4.0% by weight, of alkali oxides of a mixture of alkali and alkaline earth oxides wherein the $Li^2O$ content of total solids is 0.3-1.0% by weight;
   (b) 30-80% by weight, basis total solids, cordierite glass; and
   (c) 0-40% by weight, basis total solids, of a ceramic filler selected from the group consisting of alumina, quartz, aluminum phosphate, aluminum nitride, boron nitride, fused silica, and mixtures thereof.

2. The composition of claim 1 wherein the borosilicate glass (a) contains 0.9-3.0% by weight mixed $Na_2O$ and $K_2O$, basis total glass.

3. The composition of claim 2 wherein the borosilicate glass (a) comprises on a weight basis, 72% $SiO_2$, 25% $B_2O_3$, 1% $K_2O$, 0.5% $Li_2O$ and 0.5% $Na_2O$.

4. The composition of claim 1 wherein component (c) comprises quartz.

5. A tape casting composition comprising the composition of claim 1 dispersed in a solution of polymeric binder/plasticizer matrix in a volatile organic solvent.

6. A tape casting composition comprising the composition of claim 3 dispersed in a solution of polymeric binder/plasticizer matrix in a volatile organic solvent.

7. The tape casting composition of claim 5 wherein the binder component is selected from the group consisting of polymers of methyl methacrylate, ethyl methacrylate, methyl acrylate and mixtures thereof.

8. The tape casting composition of claim 6 wherein the binder component is selected from the group consisting of polymers of methyl methacrylate, ethyl methacrylate, methyl acrylate and mixtures thereof.

9. A tape prepared by casting a thin layer of the composition of claim 5 on a flexible substrate, heating the cast layer to remove volatile solvent therefrom and removing the solvent-free layer from the substrate.

10. A tape prepared by casting a thin layer of the composition of claim 7 on a flexible substrate, heating the cast layer to remove volatile solvent therefrom and removing the solvent-free layer from the substrate.

11. A tape prepared by casting a thin layer of the composition of claim 8 on a flexible substrate, heating the cast layer to remove volatile solvent therefrom and removing the solvent-free layer from the substrate.

12. A dielectric substrate comprising a fired layer of the tape of claim 9.

13. A dielectric substrate comprising a fired layer of the tape of claim 1.

14. A dielectric substrate comprising a fired layer of the tape of claim 4.

15. An assemblage comprising the dielectric substrate of claim 12 and an electrically functional layer.

16. An assemblage comprising the dielectric substrate of claim 13 and an electrically functional layer.

17. An assemblage comprising the dielectric substrate of claim 14 and an electrically functional layer.

18. A multilayer assemblage comprising a plurality of electrically functional layers separated by fired layers of the tape of claim 9.

19. A multilayer assemblage comprising a plurality of electrically functional layers separated by fired layers of the tape of claim 10.

20. A multilayer assemblage comprising a plurality of electrically functional layers separated by fired layers of the tape of claim 11.

* * * * *